US008686796B2

(12) United States Patent
Presti

(10) Patent No.: US 8,686,796 B2
(45) Date of Patent: Apr. 1, 2014

(54) RF POWER AMPLIFIERS WITH IMPROVED EFFICIENCY AND OUTPUT POWER

(75) Inventor: Calogero D. Presti, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/090,054

(22) Filed: Apr. 19, 2011

(65) Prior Publication Data

US 2012/0268205 A1 Oct. 25, 2012

(51) Int. Cl.
*H03F 1/22* (2006.01)
(52) U.S. Cl.
USPC .......................................... 330/311; 330/302
(58) Field of Classification Search
USPC .......................... 330/195, 277, 253, 302, 311
See application file for complete search history.

(56) References Cited

U.S. PATENT DOCUMENTS

| 4,394,590 | A |   | 7/1983  | Honda |         |
|-----------|---|---|---------|-------|---------|
| 5,012,123 | A | * | 4/1991  | Ayasli et al. | 307/112 |
| 6,924,701 | B1| * | 8/2005  | Bhandari | 330/261 |
| 7,071,786 | B2| * | 7/2006  | Inoue et al. | 330/311 |
| 7,088,356 | B2|   | 8/2006  | Nishimura |       |
| 7,245,517 | B2|   | 7/2007  | Takashima |       |
| 7,352,247 | B2|   | 4/2008  | Oh et al. |       |
| 7,786,807 | B1| * | 8/2010  | Li et al. | 330/311 |
| 7,821,349 | B2| * | 10/2010 | Park et al. | 331/167 |
| 7,960,772 | B2| * | 6/2011  | Englekirk | 330/311 |
| 8,098,099 | B2| * | 1/2012  | Kao et al. | 330/260 |
| 2008/0230818 | A1 |   | 9/2008 | Kumura et al. |   |
| 2009/0207939 | A1 |   | 8/2009 | Mertens et al. |   |
| 2011/0025408 | A1 | * | 2/2011 | Cassia et al. | 327/535 |

FOREIGN PATENT DOCUMENTS

| DE | 102004056435 A1 | 6/2006 |
| JP |     2284510 A   | 11/1990 |
| WO | WO03079543 A1   | 9/2003 |

OTHER PUBLICATIONS

Brama, et al., "A 30.5 dBm 48% PAE CMOS Class-E PA With Integrated Balun for RF Applications," IEEE Journal of Solid-State Circuits, vol. 43, No. 8, pp. 1775-1762, Aug. 2008.
International Search Report and Written Opinion—PCT/US2012/034296—ISA/EPO—Jun. 28, 2012.
Lee, et al., "A Charging Acceleration Technique for Highly Efficient Cascode Class-E CMOS Power Amplifiers," IEEE Journal of Solid-State Circuits, vol. 45, No. 10, pp. 2184-2197, Oct. 2010.

(Continued)

*Primary Examiner* — Khanh V Nguyen
(74) *Attorney, Agent, or Firm* — Ramin Mobarhan

(57) ABSTRACT

Amplifiers with improved efficiency and output power are described. In an exemplary design, an apparatus includes an amplifier having at least three transistors and at least two capacitors. The at least three transistors are coupled in a stack and receive and amplify an input signal and provide an output signal. The at least two capacitors include at least one capacitor coupled between the drain and source of an associated transistor for each of at least two transistors in the stack, e.g., at least one capacitor for each transistor in the stack except for the bottommost transistor in the stack. The at least two capacitors recycle energy from gate-to-source parasitic capacitors of the at least two transistors to the output signal, which improves efficiency and output power of the amplifier.

16 Claims, 9 Drawing Sheets

(56) References Cited

OTHER PUBLICATIONS

Mazzanti, et al., "Analysis of Reliability and Power Efficiency in Cascode Class-E PAs", IEEE Journal of Solid-State Circuits, vol. 41, No. 5, , pp. 1222-1229, May 2006.

Song, et al., "A CMOS Class-E Power Amplifier With Voltage Stress Relief and Enhanced Efficiency," IEEE Transactions on Microwave Theory and Techniques, vol. 58, No. 2,, pp. 310-317, Feb. 2010.

* cited by examiner

RF POWER AMPLIFIERS WITH IMPROVED EFFICIENCY AND OUTPUT POWER

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

High output power and good efficiency are important design goals for a power amplifier. A power amplifier may be required to transmit at a high maximum output power level, e.g., +33 dBm for GSM and +27 dBm for CDMA. The power amplifier may be used in a wireless device and may consume a relatively large portion of the total power of the wireless device. Hence, a power amplifier with good efficiency and high output power may be highly desirable.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers having improved efficiency and output power are described herein. These amplifiers may be used as power amplifiers, driver amplifiers, LNAs, VGAs, etc. These amplifiers may also be used for various electronic devices such as wireless communication devices, cellular phones, personal digital assistants (PDAs), handheld devices, wireless modems, laptop computers, tablets, cordless phones, Bluetooth devices, consumer electronic devices, etc. For clarity, the use of the amplifiers as power amplifiers in wireless communication devices is described below.

Figure 1:
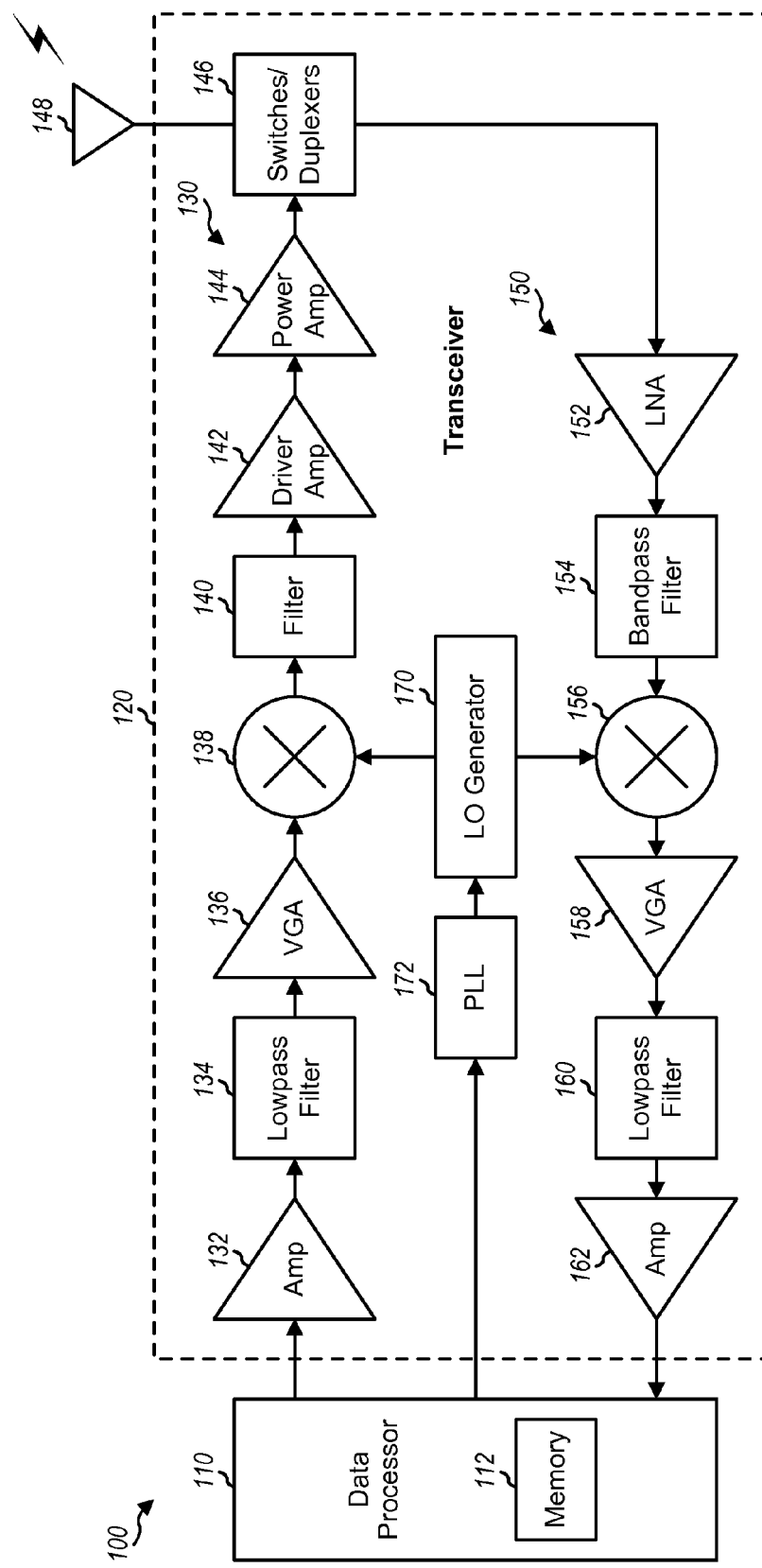
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by an upconverter 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a downconverter 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to upconverter 138 and downconverter 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for data being transmitted and received. A memory 112 may store program codes and data for data processor 110. Data processor 110 may be implemented on one or more application specific integrated circuits (ASICs) and/or other ICs.

Figure 2:
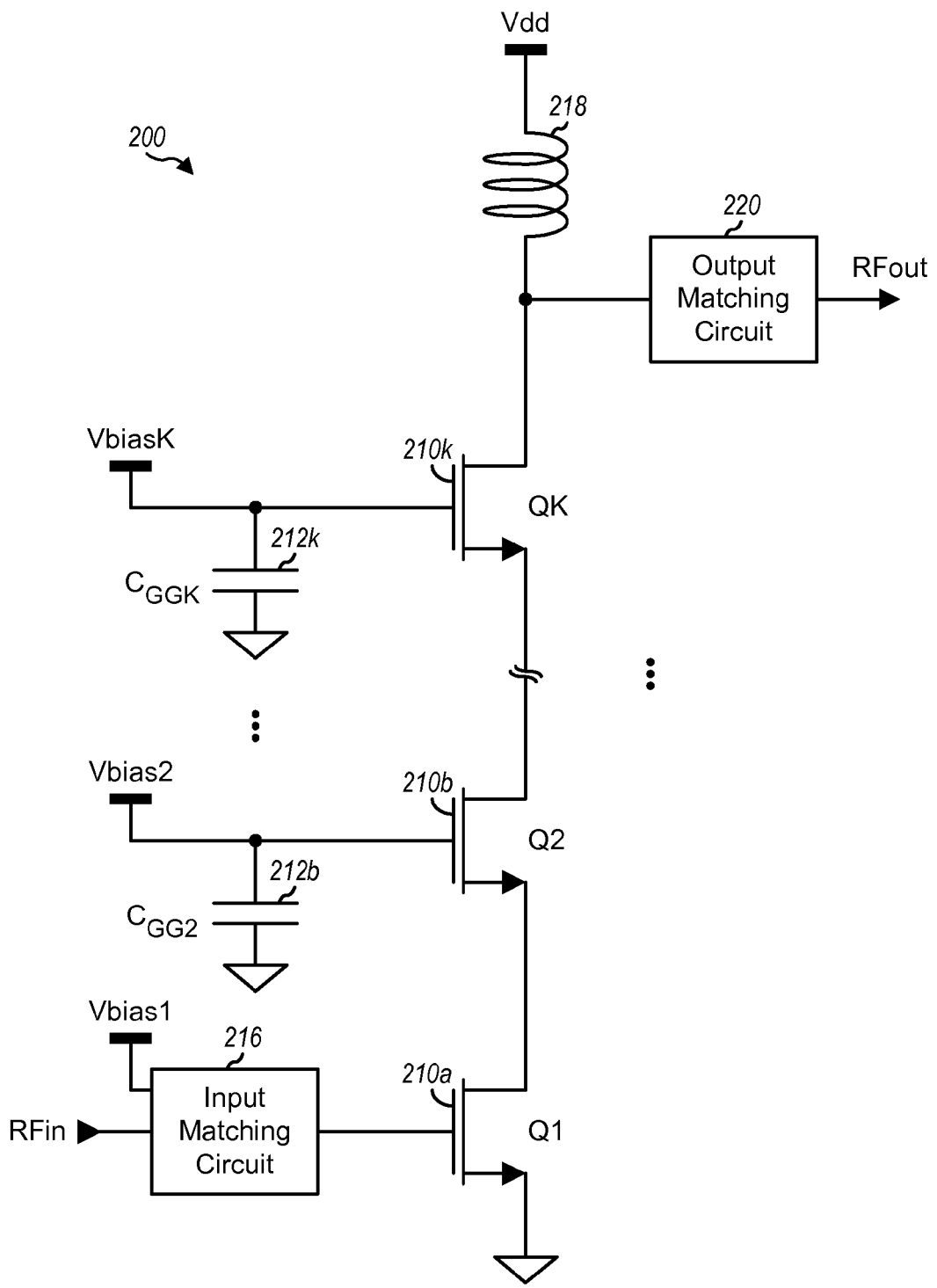
FIG. 2 shows a schematic diagram of a power amplifier.

FIG. 2 shows a schematic diagram of an exemplary design of a power amplifier 200 implemented with stacked transistors. Power amplifier 200 may be used for power amplifier 144 or driver amplifier 142 in FIG. 1. In the exemplary design shown in FIG. 2, power amplifier 200 is implemented with K N-channel metal oxide semiconductor (NMOS) transistors 210a through 210k coupled in a stack (or in series), where K is three or greater. The number of NMOS transistors to couple in a stack (K) may be dependent on various factors such as a power supply voltage (Vdd) used for power amplifier 200, an expected maximum voltage swing of an output RF signal (RFout) from power amplifier 200, a breakdown voltage of each NMOS transistor 210, etc.

An input matching circuit 216 receives an input RF signal (RFin) at one end and has its other end coupled to the gate of the bottommost NMOS transistor 210a. NMOS transistor 210a has its source coupled to circuit ground. Each remaining NMOS transistor 210 in the stack has its gate receiving a bias voltage (Vbias) and its source coupled to the drain of an immediately lower NMOS transistor in the stack. An inductor 218 is coupled between the power supply (Vdd) and the drain of the topmost NMOS transistor 210k. An output matching circuit 220 has one end coupled to the drain of the topmost NMOS transistor 210k and the other end providing the RFout signal. The RFout signal may be provided to a load (not shown in FIG. 2), which may be an antenna or some other circuit.

Bypass capacitors 212b through 212k have one end coupled to the gates of NMOS transistors 210b through 210k, respectively, and the other end coupled to circuit ground. Bias voltages Vbias2 through VbiasK are provided to the gates of NMOS transistors 210b through 210k, respectively. A Vbias1 voltage is provided to the gate of the bottommost NMOS transistor 210a via input matching circuit 216 (as shown in FIG. 2) or via the RFin signal (not shown in FIG. 2).

Improved reliability may be achieved by using multiple (K) NMOS transistors coupled in a stack. The RFout signal may have a large voltage swing, which may exceed the breakdown voltage of one NMOS transistor. The large voltage swing of the RFout signal may be split or distributed approximately equally across the K NMOS transistors 210a through 210k. Each NMOS transistor 210 may then observe only a fraction of the large voltage swing, which should be less than the breakdown voltage of the NMOS transistor in order to achieve good reliability for power amplifier 200. The use of stacked transistors is especially desirable for high frequency amplifiers implemented with transistors fabricated with deep sub-micron IC processes and having low breakdown voltages. The stacked transistors can essentially multiply the breakdown voltage by a factor of K to improve reliability.

Power amplifier 200 operates as follows. The bottommost NMOS transistor 210a is a gain transistor that provides signal amplification for the RFin signal. The remaining NMOS transistors 210b through 210k provide signal amplification as well as signal drive for the RFout signal. Bypass capacitors 212b through 212k provide filtering for the Vbias2 through VbiasK voltages, respectively. The Vbias1 through VbiasK voltages provide the desired biasing for NMOS transistors 210a through 210k, respectively, and may be selected to obtain the desired distribution of the large voltage swing of the output RF signal across the K NMOS transistors. Input matching circuit 216 provides input impedance matching for power amplifier 200. Output matching circuit 220 provides output impedance matching for power amplifier 200.

The sizes and impedances of bypass capacitors 212b through 212k may be selected through computer simulation or calculations to allow some voltage swing at the gates of NMOS transistors 210b through 210k, respectively, such that the voltage swing across the terminals of NMOS transistors 210b through 210k is balanced across the transistor stack. Capacitors 212b through 212k may be progressively smaller further up the transistor stack, with capacitor 212b being the largest and capacitor 212k being the smallest. This is because the voltage swing at the drains of NMOS transistors 210b through 210k is progressively larger further up the transistor stack. A smaller capacitor 212k allows for a larger voltage swing at the gate of NMOS transistor 210k as K increases, so that the quantity max $|V_{DK}-V_{GK}|$ is kept under control, where $V_{GK}$ is the gate voltage and $V_{DK}$ is the drain voltage of NMOS transistor 210k.

FIG. 2 shows an exemplary design of power amplifier 200. In general, a power amplifier may be implemented with any number of NMOS transistors coupled in a stack. A power amplifier may also include different and/or additional circuit components not shown in FIG. 2. For example, K–1 resistors may be used to provide isolation for NMOS transistors 210b through 210k and may have one end receiving the Vbias2 through VbiasK voltages and the other end coupled to the gates of NMOS transistors 210b through 210k. As another example, diode-connected NMOS transistors may be used in place of resistors to provide isolation for NMOS transistors 210b through 210k. The diode-connected NMOS transistors may improve the gain and/or linearity of the power amplifier.

Figure 3:
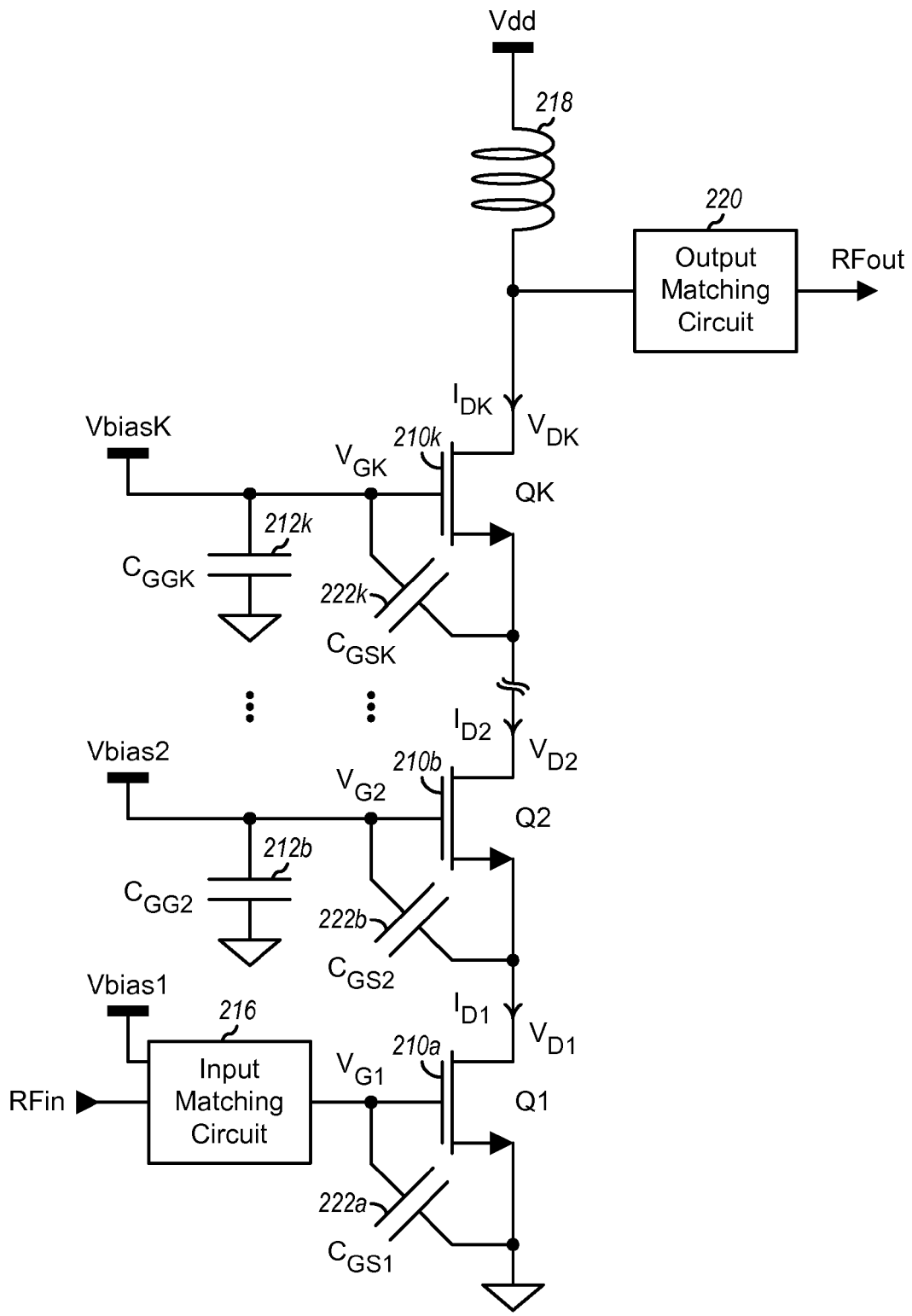
FIG. 3 shows a model of the power amplifier in FIG. 2.

FIG. 3 shows a model of power amplifier 200 in FIG. 2. Each NMOS transistor 210 may include various parasitic capacitors. For simplicity, only a gate-to-source parasitic capacitor ($C_{GS}$) for each NMOS transistor is shown in FIG. 3 and is coupled between the gate and source of the NMOS transistor. $C_{GS}$ parasitic capacitors 222a through 222k are shown for NMOS transistors 210a through 210k, respectively, in FIG. 3.

During the operation of power amplifier 200, the $C_{GS}$ parasitic capacitor 222 of each NMOS transistor in the stack is repeatedly charged and discharged. The continual charging and discharging of the $C_{GS1}$ through $C_{GSK}$ parasitic capacitors of the K NMOS transistors results in energy loss and hence reduces the efficiency of power amplifier 200. The $C_{GS1}$ parasitic capacitor of the bottommost NMOS transistor 210a may be tuned out by input matching circuit 216. In this case, there may be negligible energy loss via the $C_{GS1}$ parasitic capacitor. However, most of the energy stored in the $C_{GS2}$ through $C_{GSK}$ parasitic capacitors of the remaining NMOS transistors may be lost in every RF cycle.

Figure 4:
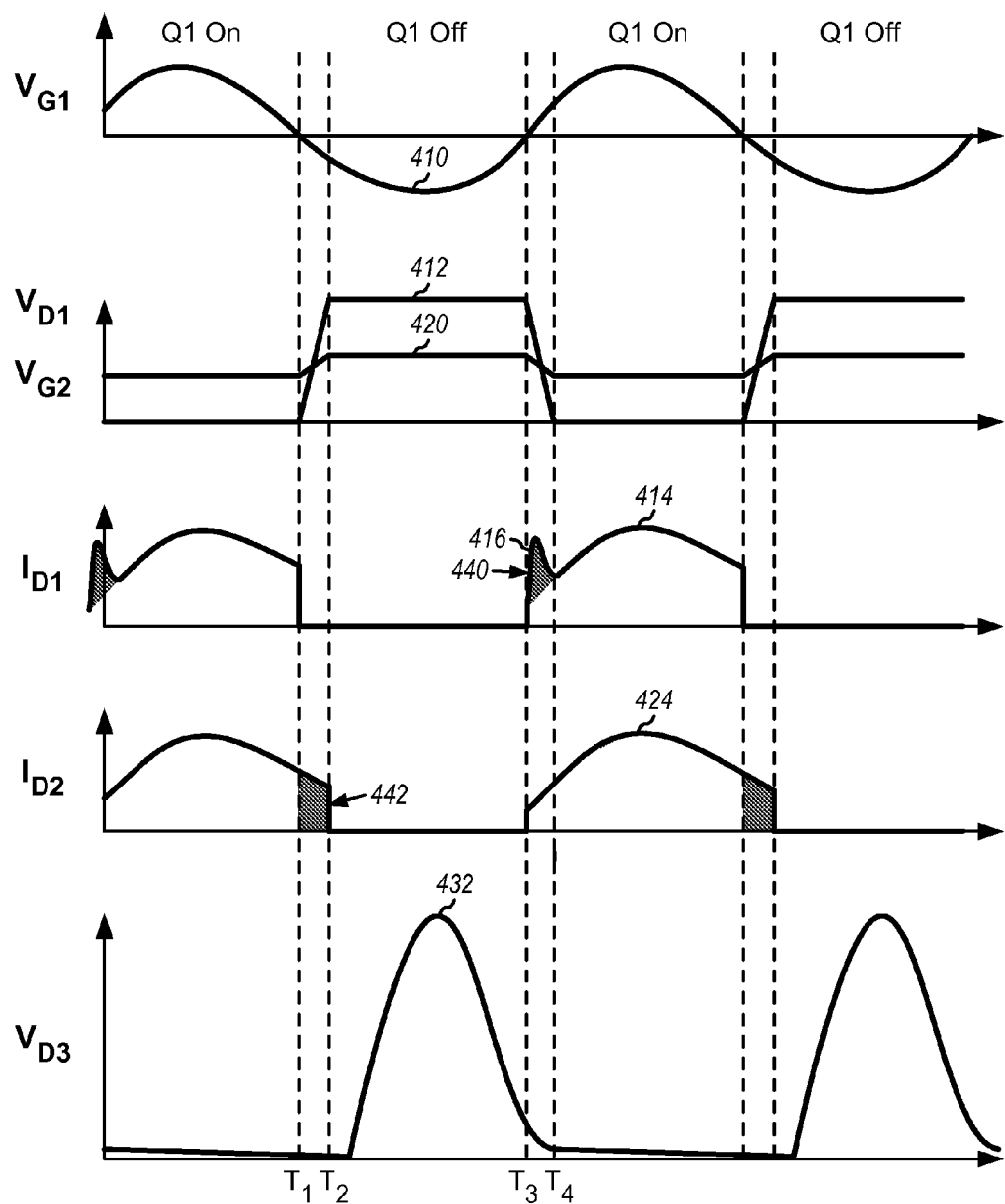
FIG. 4 shows signals at various nodes within the power amplifier in FIG. 2.

FIG. 4 shows a diagram of signals at various nodes within power amplifier 200 in FIGS. 2 and 3. For simplicity, FIG. 4 shows a case in which K=3, and three NMOS transistors 210a, 210b and 210k are coupled in a stack. A plot 410 shows a gate voltage signal ($V_{G1}$) at the gate of the bottommost NMOS transistor 210a. A plot 412 shows a drain voltage signal ($V_{D1}$) at the drain of NMOS transistor 210a. The $V_{D1}$ signal has a polarity that is opposite of the polarity of the $V_{G1}$ signal. The $V_{D1}$ signal switches polarity when the $V_{G1}$ signal crosses a threshold voltage. When the $V_{G1}$ signal falls below the threshold voltage at time $T_1$, the $V_{D1}$ signal transitions from low to high from time $T_1$ to time $T_2$. Conversely, when the $V_{G1}$ signal exceeds the threshold voltage at time $T_3$, the $V_{D1}$ signal transitions from high to low from time $T_3$ to time $T_4$. The rate of the transitions in the $V_{D1}$ signal is determined by the speed of NMOS transistor 210a. A plot 414 shows a drain current signal ($I_{D1}$) at the drain of NMOS transistor 210a. The $I_{D1}$ signal (i) is approximately zero when the $V_{G1}$ signal is below the threshold voltage and (ii) generally follows the $V_{G1}$ signal when the $V_{G1}$ signal exceeds the threshold voltage. The $I_{D1}$ signal also has a spike 416 from time $T_3$ to time $T_4$ when the $V_{G1}$ signal transitions above the threshold voltage at time $T_3$.

A plot 420 shows a gate voltage signal ($V_{G2}$) at the gate of the middle NMOS transistor 210b. The $V_{G2}$ signal resembles an attenuated version of the $V_{D1}$ signal. A plot 424 shows a drain current signal ($I_{D2}$) at the drain of NMOS transistor 210b. The $I_{D2}$ signal (i) is approximately zero when the $V_{D1}$ signal is high and (ii) generally follows the $I_{D1}$ signal otherwise. However, the $I_{D2}$ signal transitions low later than the $I_{D1}$ signal and further does not include a spike when transitioning high. A plot 432 shows a drain voltage signal ($V_{D3}$) at the drain of the topmost NMOS transistor 210k.

Although not shown in FIG. 4 for simplicity, a drain voltage signal ($V_{D2}$) of NMOS transistor 210b resembles a delayed version of the $V_{D1}$ signal. A gate voltage signal ($V_{G3}$) at the gate of the topmost NMOS transistor 210k resembles an attenuated version of the $V_{D2}$ signal. A drain current signal ($I_{D3}$) at the drain of NMOS transistor 210k (i) is approximately zero when the $V_{D2}$ signal is high and (ii) generally follows the $I_{D1}$ signal otherwise.

Spike 416 results from the bottommost NMOS transistor 210a charging the $C_{GS2}$ parasitic capacitor when the $V_{G1}$ signal crosses the threshold voltage and goes high. An area 440 under spike 416 represents the energy that this lost through NMOS transistor 210a. The current from NMOS transistor 210b charges the $C_{GS2}$ parasitic capacitor from time $T_1$ to time $T_2$. An area 442 represents the energy from the Vdd supply that is stored in the $C_{GS2}$ parasitic capacitor and bypass capacitor 212b.

As shown in FIG. 4, energy is lost to charge and discharge intermediate nodes in power amplifier 200 with stacked NMOS transistors. This energy loss reduces the efficiency of the power amplifier.

In an aspect, a drain-to-source capacitor ($C_{DS}$) may be added between the drain and source of each NMOS transistor in a stack, possibly except for the bottommost NMOS transistor, in order to improve the efficiency of a power amplifier. The $C_{DS}$ capacitors may enable recycling of energy that would otherwise be lost due to continual charging and discharging of intermediate nodes in the stacked NMOS transistors.

Figure 5:
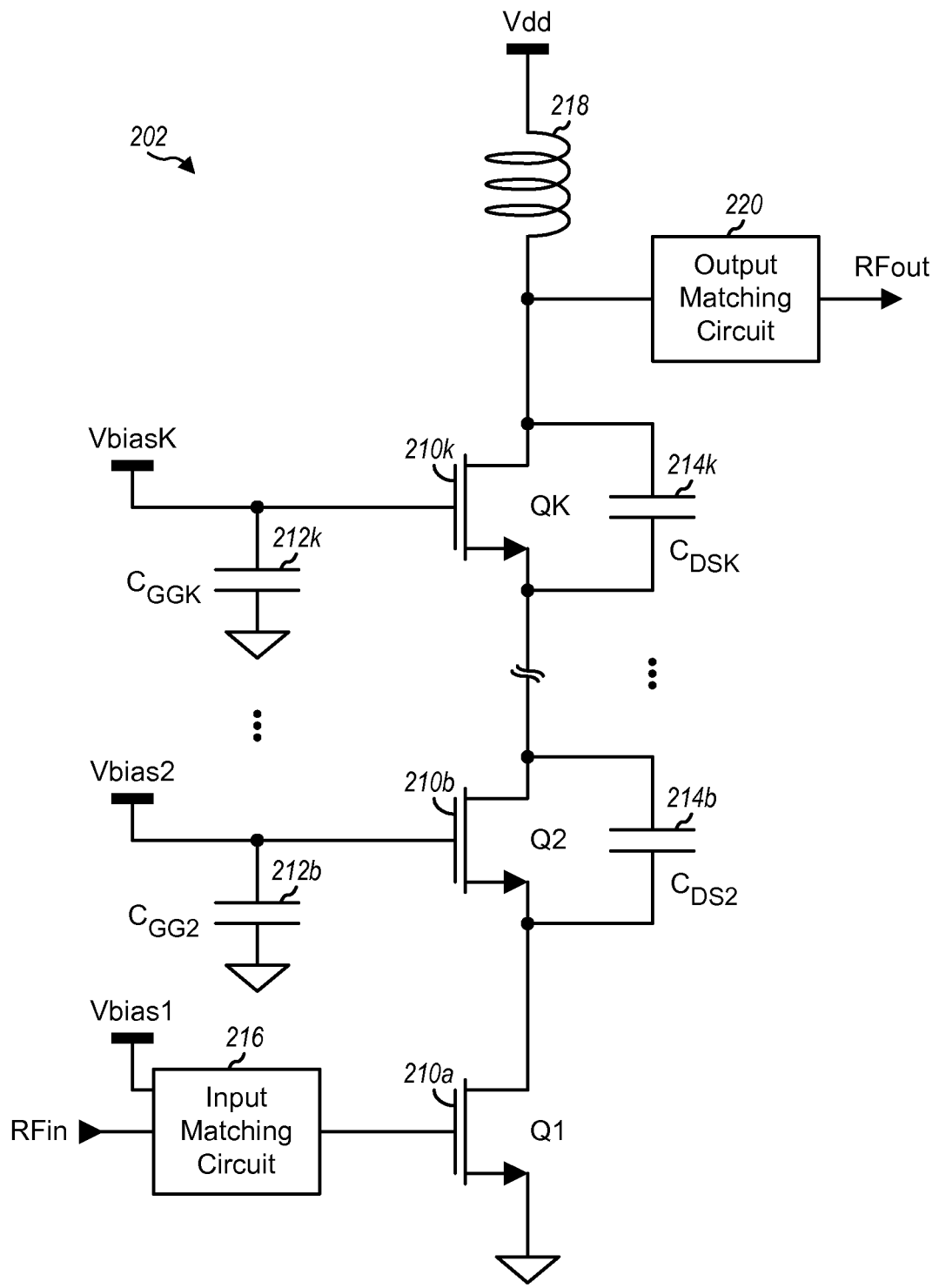
FIG. 5 shows a schematic diagram of a power amplifier with improved efficiency.

FIG. 5 shows a schematic diagram of an exemplary design of a power amplifier 202 implemented with stacked transistors and having improved efficiency. Power amplifier 202 includes all of the circuit components in power amplifier 200 in FIG. 2. Power amplifier 202 further includes K−1 capacitors 214b through 214k for K−1 NMOS transistors 210b through 210k, respectively. Each capacitor 214 has one end coupled to the drain of an associated NMOS transistor 210 and the other end coupled to the source of the associated NMOS transistor. Capacitors 214b through 214k may enable recycling of otherwise lost energy, as described below.

Capacitors 214b through 214k may be designed with suitable capacitances, which may be determined based on computer simulation, empirical measurement, etc. Capacitors 214b through 214k may also be located close to NMOS transistors 210b through 210k, respectively, to improve their effectiveness. In one exemplary design, capacitors 214b through 214k may be explicitly implemented, e.g., using a fabrication process normally used to form capacitors on an RFIC. In another exemplary design, capacitors 214b through 214k may be implicitly implemented, e.g., with parasitic metal capacitances.

Although not shown in FIG. 5, a shunt capacitor may be added between the drain of NMOS transistor 210a and circuit ground. A shunt capacitor may also be added between the drain of any remaining NMOS transistor in the stack and circuit ground. The shunt capacitors may be used to reduce voltage overshoot when the operating frequency of power amplifier 202 is low relative to the transistor capability. These shunt capacitors may also be used to reduce the harmonic content at the amplifier output.

Figure 6:
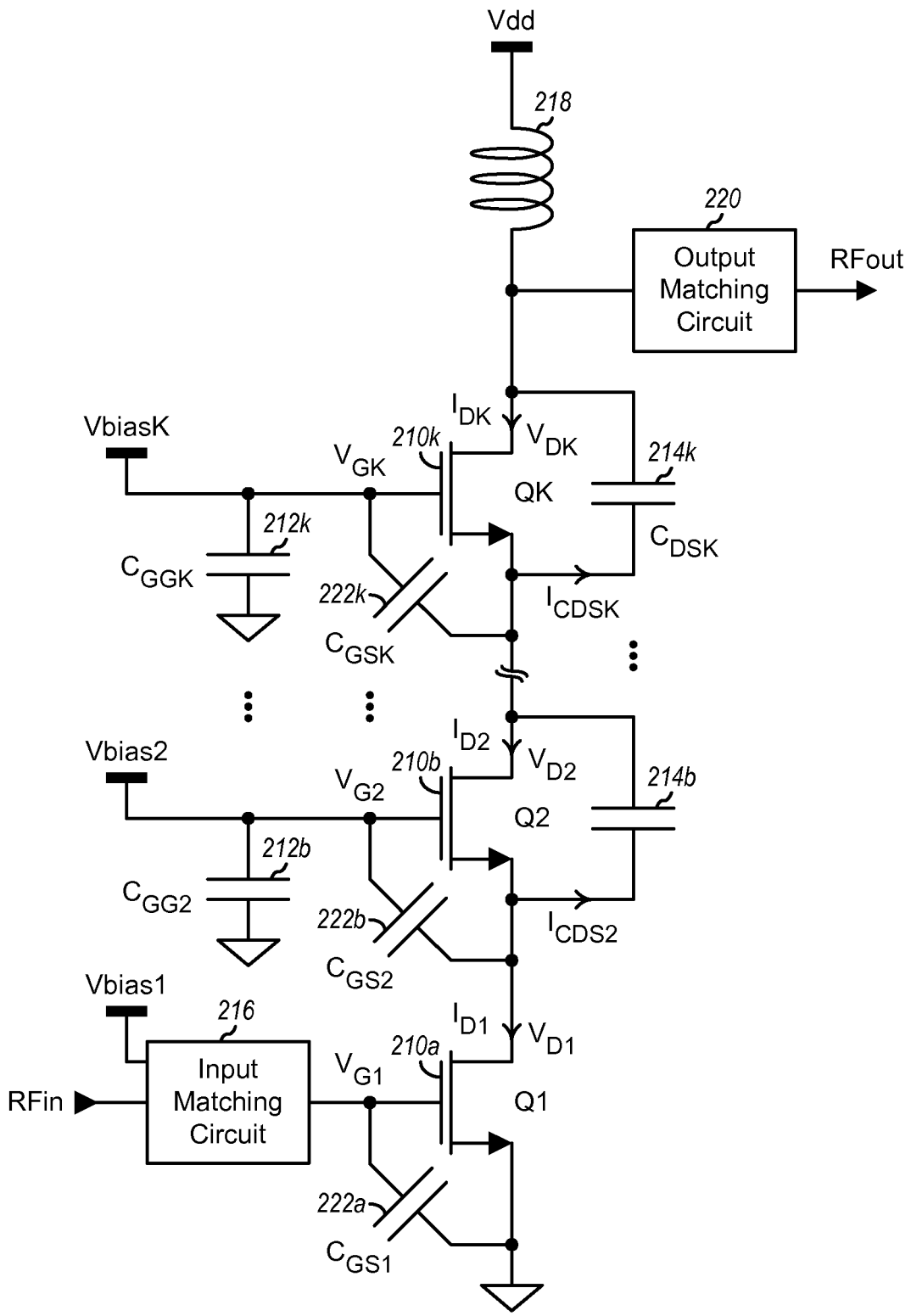
FIG. 6 shows a model of the power amplifier in FIG. 5.

FIG. 6 shows a model of power amplifier 202 in FIG. 5. The model includes all circuit components in FIG. 5. The model further includes $C_{GS1}$ through $C_{GSK}$ parasitic capacitors 222a through 222k for NMOS transistors 210a through 210k, respectively.

Figure 7:
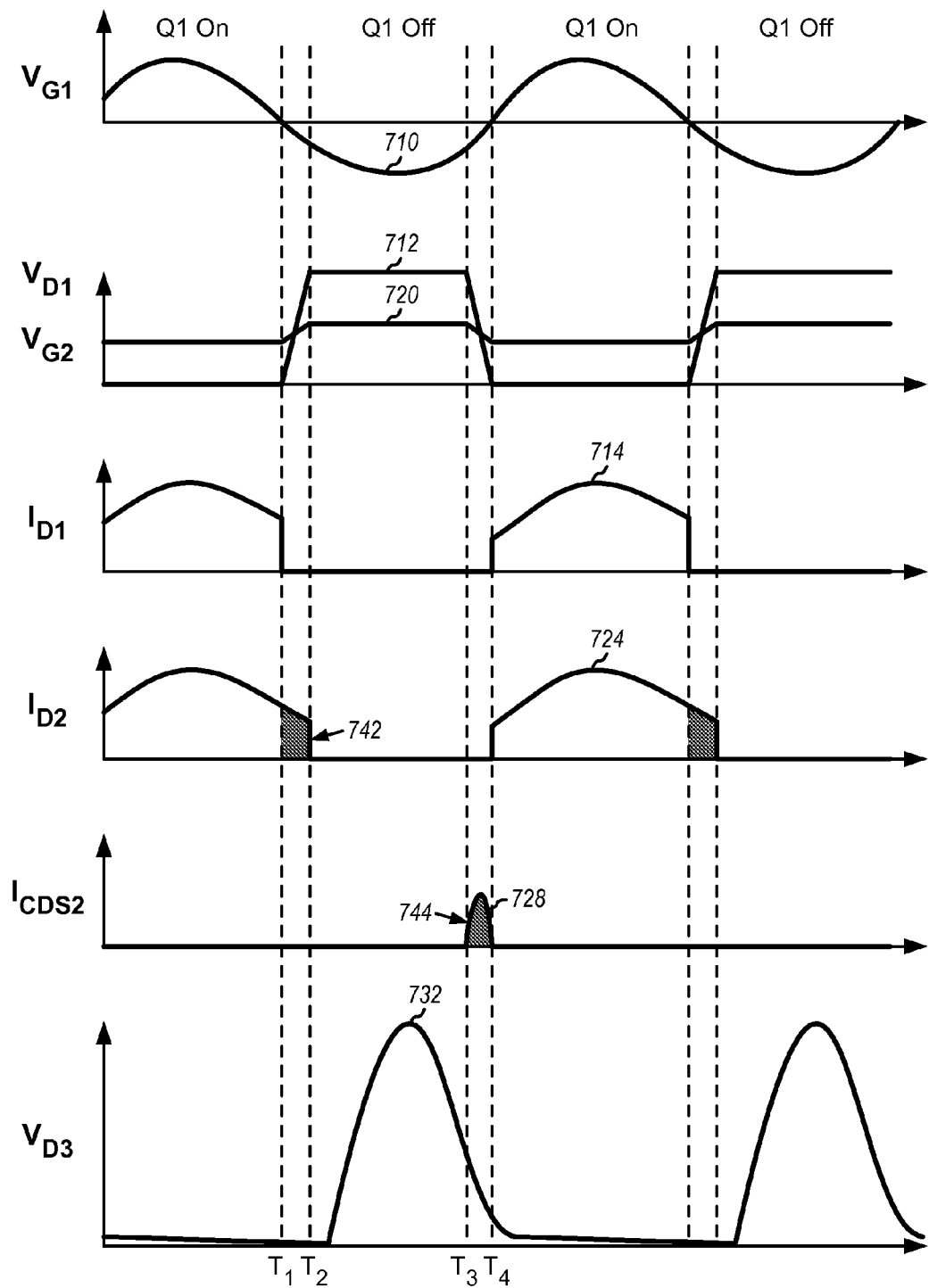
FIG. 7 shows signals at various nodes within the power amplifier in FIG. 5.

FIG. 7 shows a diagram of signals at various nodes within power amplifier 202 in FIGS. 5 and 6. For simplicity, FIG. 7 shows a case in which K=3, and three NMOS transistors 210a, 210b and 210k are coupled in a stack. FIG. 7 shows a plot 710 for the $V_{G1}$ signal at the gate of the bottommost NMOS transistor 210a, a plot 712 for the $V_{D1}$ signal at the drain of NMOS transistor 210a, and plot 714 for the $I_{D1}$ signal at the drain of NMOS transistor 210a. FIG. 7 also shows a plot 720 for the $V_{G2}$ signal at the gate of the middle NMOS transistor 210b, and a plot 724 for the $I_{D2}$ signal at the drain of NMOS transistor 210b. FIG. 7 also shows a plot 732 for the $V_{D3}$ signal at the drain of the topmost NMOS transistor 210k. FIG. 7 further shows a plot 728 of the $I_{CDS2}$ current flowing through $C_{DS2}$ capacitors 214b.

Although not shown in FIG. 7 for simplicity, the $V_{D2}$ voltage of NMOS transistor 210b has (i) rising edges that are delayed with respect to the rising edges of the $V_{D1}$ signal and (ii) falling edges that are approximately aligned with the falling edges of the $V_{D1}$ and $V_{D3}$ signals. The $V_{G3}$ voltage resembles an attenuated version of the $V_{D2}$ signal. The $I_{D3}$ signal is approximately zero when the $V_{D2}$ signal is high and generally follows the $I_{D1}$ signal otherwise. The $I_{CDS3}$ signal resembles the $I_{CDS2}$ signal. The spikes of all $I_{CDS1}$ through $I_{CDSK}$ signals are generally aligned with the falling edges of the $V_{D3}$ signal.

As shown in FIG. 7, the $C_{DS2}$ capacitor 214b and the $C_{DSK}$ capacitor 214k couple a portion of the RFout signal to the drain of NMOS transistor 210a. When the $V_{D1}$ signal transitions from high to low, the $C_{GS2}$ parasitic capacitor 222b is discharged through the $C_{DS2}$ capacitor 214b between time $T_3$ and time $T_4$. The energy that flows through the $C_{DS2}$ capacitor 214b, which is shown by an area 744, is recycled to the output of power amplifier 202. Similarly, the $C_{GSK}$ parasitic capacitor is discharged through the $C_{DSK}$ capacitor 214k between time $T_3$ and time $T_4$, and the energy that flows through the $C_{DSK}$ capacitor 214k is recycled to the output of power amplifier 202. The current from NMOS transistor 210b charges the $C_{GS2}$ parasitic capacitor 222b from time $T_1$ to time $T_2$. An area 742 represents the energy from the Vdd supply that is stored in the $C_{GS2}$ parasitic capacitor 222b and bypass capacitor 212b.

The $V_{D3}$ voltage at the output of power amplifier 202 falls down naturally because the output impedance matching is properly tuned. With the added $C_{DS}$ capacitors, the voltage fall-down at the output of power amplifier 202 is fed to the intermediate nodes. In FIG. 7, the $V_{D1}$ voltage falls down with the presence of the $C_{DS2}$ through $C_{DSK}$ capacitors, which couple the amplifier output to the intermediate nodes and to the $V_{D1}$ voltage in particular.

As shown in FIG. 7, energy due to charging and discharging of intermediate nodes in power amplifier 202 may be recycled with the $C_{DS}$ capacitors 214b through 214k. The recycled energy improves the efficiency of the power amplifier.

Figure 8:
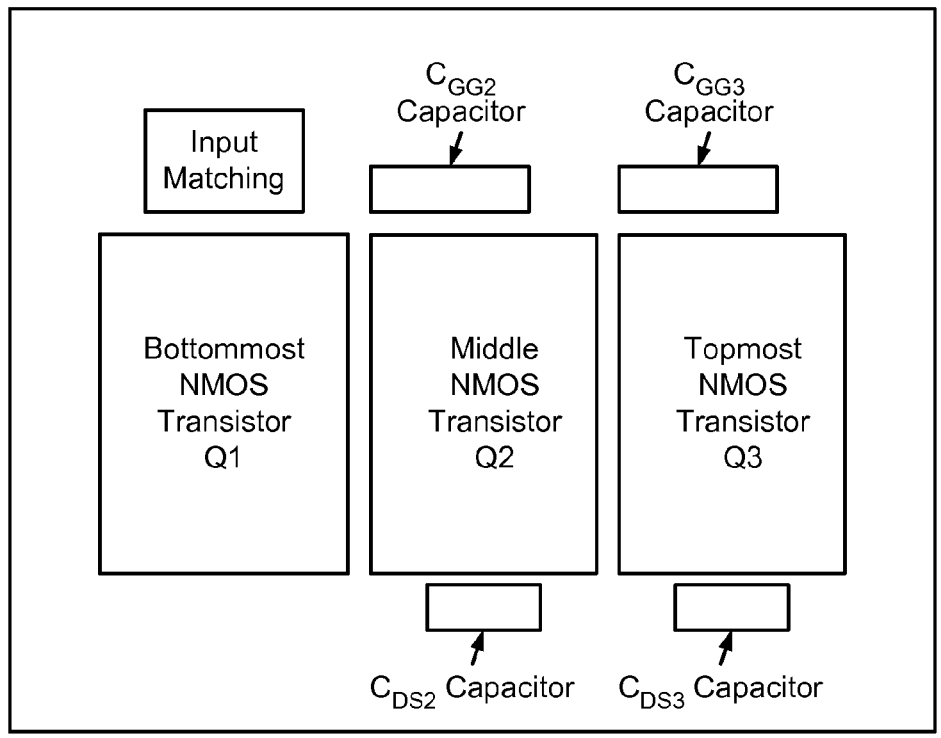
FIG. 8 shows an exemplary layout of the power amplifier in FIG. 5.

FIG. 8 shows an exemplary layout of power amplifier 202 in FIG. 5 for a case in which K=3. Three NMOS transistors 210a, 210b and 210k are coupled in a stack and are also referred to as Q1, Q2 and Q3, respectively. The three NMOS transistors Q1, Q2 and Q3 may be formed side by side, as shown in FIG. 8. Two drain-to-source capacitors $C_{DS2}$ and $C_{DS3}$ may be formed next to one side of two NMOS transistors Q2 and Q3, respectively. Two bypass capacitors $C_{GG2}$ and $C_{GG3}$ may be formed next to the other side of NMOS transistors Q2 and Q3, respectively. The other circuit components for power amplifier 202 may be formed near NMOS transistors Q1, Q2 and Q3 to provide good performance.

Figure 9:
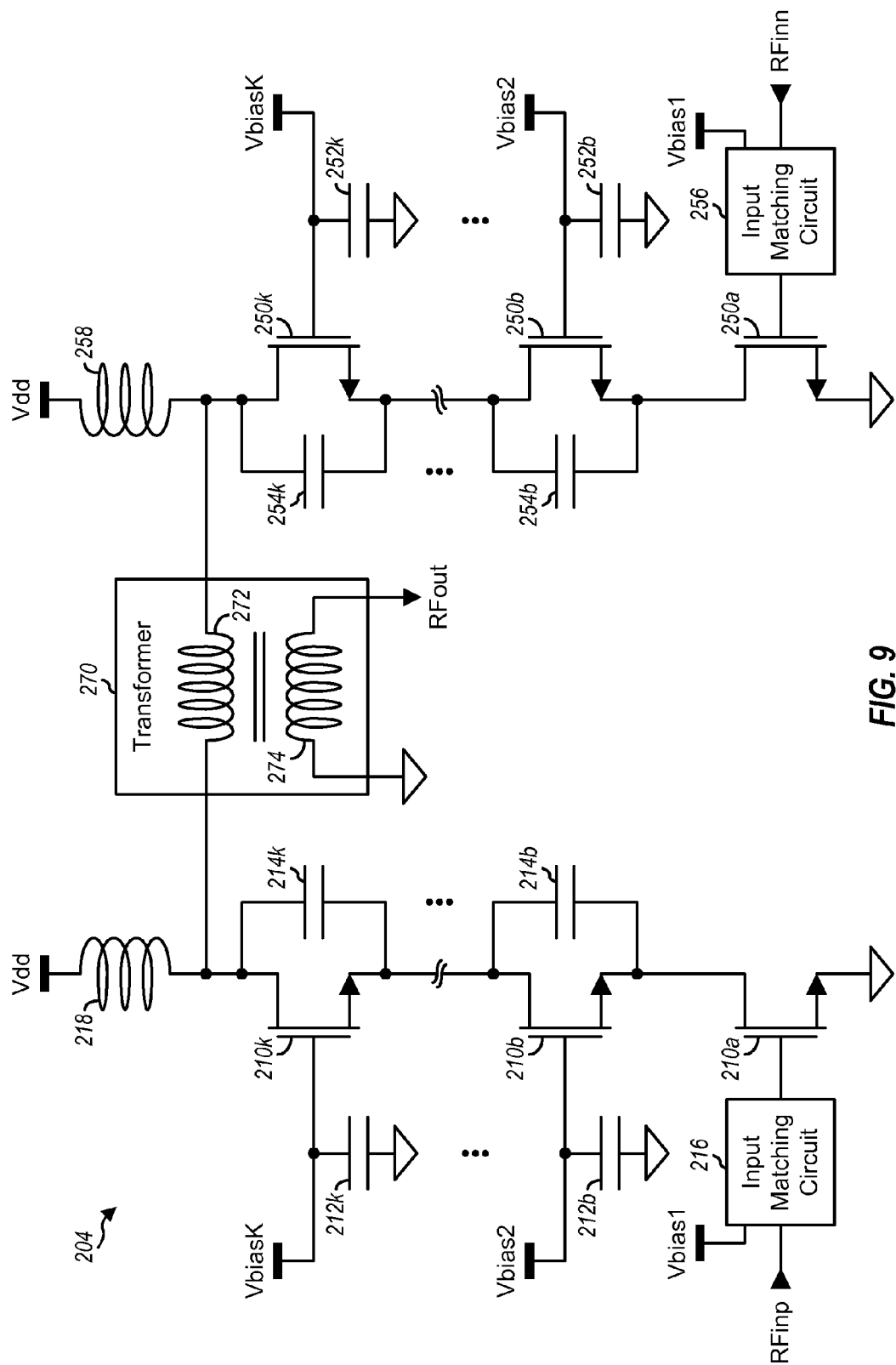
FIG. 9 shows a schematic diagram of a differential power amplifier.

FIG. 9 shows a schematic diagram of an exemplary differential design of a power amplifier 204 implemented with stacked transistors and having improved efficiency. Differential power amplifier 204 includes all of the circuit components, except for output matching circuit 220, in single-ended power amplifier 202 in FIG. 5, which form one half of the differential power amplifier. Differential power amplifier 204 further includes K NMOS transistors 250a through 250k, K−1 bypass capacitors 252b through 252k, K−1 drain-to-source capacitors 254b through 254k, an input matching circuit 256, and an inductor 258, which form the other half of the differential power amplifier. NMOS transistors 250a through 250k are coupled in a stack. Bypass capacitors 252b through 252k are coupled to the gates of NMOS transistors 250b through 250k, respectively. Capacitors 254b through 254k are coupled between the drain and source of NMOS transistors 252b through 252k, respectively. Input matching circuit 256 is coupled to the gate of the bottommost NMOS transistor 250a.

In the exemplary design shown in FIG. 9, differential power amplifier 204 further includes a transformer 270 having a primary coil 272 and a secondary coil 274. Primary coil 272 has its two ends coupled to the drains of the topmost NMOS transistors 210k and 250k. Secondary coil 274 has one end coupled to circuit ground and the other end providing the single-ended RFout signal. A differential RFin signal includes a RFinp signal and a RFinn signal. The RFinp signal is provided to input matching circuit 216, and the RFinn signal is provided to input matching circuit 256.

FIG. 9 shows an exemplary design of a differential power amplifier that implements the techniques described herein for improved efficiency. A differential power amplifier may also be implemented with various other designs. For example, transformer 270 may be combined with an output matching circuit at primary coil 272 or secondary coil 274. An output matching circuit may also be omitted. Differential to single-ended conversion may be achieved with transformer 270, as shown in FIG. 9. Differential to single-ended conversion may also be achieved using LC-CL matching, or a 180° coupler, or some other mechanism. A balanced amplifier may also be implemented and may receive input signals that are shifted by 90° and provide output signals that are combined using 90° hybrids. Two input matching circuits may be used for the RFinp and RFinn signals, as shown in FIG. 9. Alternatively, the two input matching circuits may be combined into one fully differential input matching circuit, which may also perform single-ended to differential conversion.

For clarity, power amplifiers implemented with NMOS transistors have been described above. Power amplifiers may also be implemented with P-channel metal oxide semiconductor (PMOS) transistors, a combination of NMOS and PMOS transistors, transistors of other types, or a combination thereof Capacitors may be coupled between the drain and source of all or a subset of the transistors in a stack to improve efficiency and output power.

In an exemplary design, an apparatus (e.g., a wireless device, an IC, etc.) may comprise an amplifier including at least three transistors (e.g., NMOS transistors 210a through 210k in FIG. 5) and at least two capacitors (e.g., capacitors 214b through 214k). The at least three transistors may be coupled in a stack and may receive and amplify an input signal and provide an output signal. The at least two capacitors may include at least one capacitor coupled between the drain and source of an associated transistor for each of at least two transistors in the stack, e.g., as shown in FIG. 5. The at least one capacitor may be located next to the associated transistor, e.g., as shown in FIG. 8. In an exemplary design, the at least two capacitors may include at least one (e.g., one) capacitor for each transistor in the stack except for the bottommost transistor in the stack (e.g., as shown in FIG. 5). The at least two capacitors may recycle energy from the gate-to-source parasitic capacitors of the at least two transistors to the output signal.

In an exemplary design, the at least three transistors may include a first transistor, a second transistor, and a third transistor. The first transistor may have its source coupled to circuit ground and its drain coupled to the source of the second transistor. The second transistor may have its drain coupled to the source of the third transistor. In an exemplary design, the first transistor may receive the input signal, and the third transistor may provide the output signal. The stack may also include more than three transistors. The at least three transistors may comprise MOS transistors (e.g., NMOS transistors) or transistors of other types.

In an exemplary design, the amplifier may further include at least two bypass capacitors (e.g., capacitors 212b through 212k in FIG. 5) for the at least two transistors in the stack, at least one bypass capacitor for each of the at least two transistors. Each bypass capacitor may be coupled to the gate of an associated transistor.

In an exemplary design, the amplifier may further include at least three second transistors (e.g., NMOS transistors 250a through 250k in FIG. 9) and at least two second capacitors (e.g., capacitors 254b through 254k). The at least three second transistors may be coupled in a second stack and may receive and amplify a second input signal and provide a second output signal. The at least two second capacitors may include at least one second capacitor coupled between the drain and source of an associated second transistor for each of at least two second transistors in the second stack.

The amplifier may further include a transformer coupled to the topmost transistor in the stack and also to the topmost second transistor in the second stack (e.g., as shown in FIG. 9). The amplifier may be a differential amplifier. The input signal and the second input signal may form a differential input signal. The output signal and the second output signal may form a differential output signal. The transformer may receive the differential output signal and provide a single-ended output signal.

In an exemplary design, the amplifier may be a power amplifier that receives an input RF signal and provides an output RF signal. In an exemplary design, the apparatus may be a wireless device and may further include an antenna coupled directly or indirectly to the power amplifier and used to transmit the output RF signal.

Figure 10:
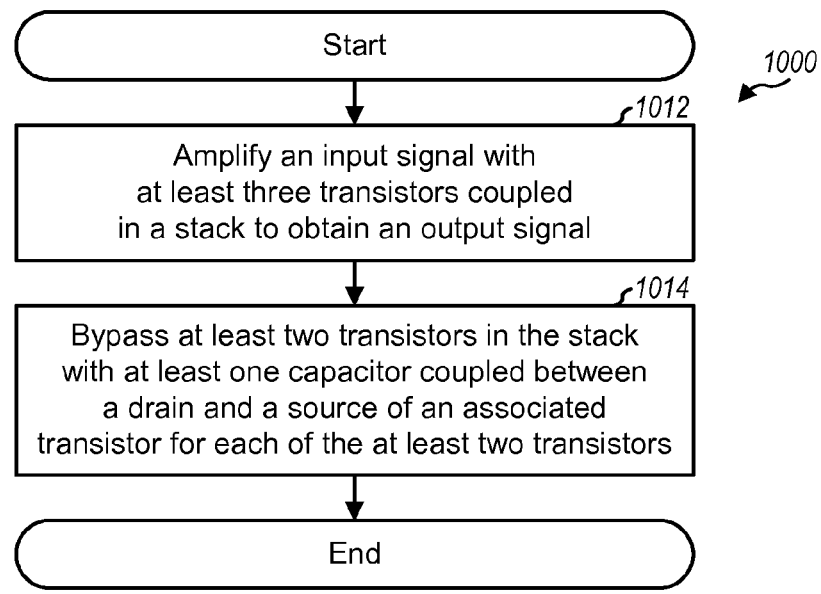
FIG. 10 shows a process for performing signal amplification.

FIG. 10 shows an exemplary design of a process 1000 for performing signal amplification. An input signal may be amplified with at least three transistors coupled in a stack to obtain an output signal (block 1012). At least two transistors in the stack may be bypassed with at least one capacitor coupled between the drain and source of an associated transistor for each of the at least two transistors (block 1014). In an exemplary design, each transistor in the stack except for the bottommost transistor in the stack may be bypassed with at least one capacitor.

The techniques described herein may improve efficiency and output power of a power amplifier based on transistor stacking By adding a few small drain-to-source capacitors to transistors in the stack, energy loss due to continual charging and discharging of intermediate nodes in the power amplifier may be reduced, and efficiency and output power may be significantly improved. The techniques may be especially advantageous for a MOS power amplifier required to provide a large voltage swing and utilizing a number of MOS transistors coupled in a stack to provide the large voltage swing. The techniques may also be particularly suited for a power amplifier implemented with sub-micron transistors having a low breakdown voltage and requiring three or more transistors to provide the required large voltage swing. The techniques may also be used for various IC process technologies and may be particularly effective in silicon-on-insulator (SOI) MOS processes.

An amplifier described herein may be implemented on an IC, an analog IC, an RFIC, a mixed-signal IC, an ASIC, a printed circuit board (PCB), an electronic device, etc. An amplifier may also be fabricated with various IC process technologies such as NMOS, PMOS, complementary MOS (CMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), SOI, etc.

An apparatus implementing an amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier comprising:
      at least three transistors coupled in a stack and configured to receive and amplify an input signal and provide an output signal; and
      a first capacitor coupled between a drain and a source of a first transistor in the stack and a second capacitor coupled between a drain and a source of a second transistor in the stack, wherein a third transistor in the stack is controlled by the input signal and excludes a capacitor between a drain and source of the third transistor.

2. The apparatus of claim 1, at least one of the first and second capacitors recycling energy from gate-to-source parasitic capacitors of the first and second transistors to the output signal.

3. The apparatus of claim 1, the first and second capacitors for the first and second transistors in the stack comprising parasitic metal capacitances.

4. The apparatus of claim 1, the at least three transistors comprising the first transistor, the second transistor, and a third transistor, the third transistor having a source coupled to circuit ground and a drain coupled to a source of the second transistor, and the second transistor having a drain coupled to a source of the first transistor.

5. The apparatus of claim 4, the third transistor receiving the input signal, and the first transistor providing the output signal.

6. The apparatus of claim 1, the at least three transistors comprising metal oxide semiconductor (MOS) transistors.

7. The apparatus of claim 1, the amplifier further comprising:
   at least one capacitor coupled to a gate of an associated transistor for each of the at least two transistors in the stack.

8. The apparatus of claim 1, the amplifier comprising a power amplifier to receive an input radio frequency (RF) signal and provide an output RF signal.

9. The apparatus of claim 8, further comprising:
   an antenna coupled to the power amplifier and to transmit the output RF signal.

10. The apparatus of claim 1, the amplifier further comprising:
    at least three second transistors coupled in a second stack and configured to receive and amplify a second input signal and provide a second output signal; and
    at least one second capacitor coupled between a drain and a source of an associated second transistor for each of at least two second transistors in the second stack.

11. The apparatus of claim 10, the amplifier comprising a differential amplifier, the input signal and the second input signal forming a differential input signal, and the output signal and the second output signal forming a differential output signal.

12. The apparatus of claim 10, further comprising:

a transformer coupled to a topmost transistor in the stack and a topmost second transistor in the second stack and to provide a single-ended output signal.

13. An integrated circuit comprising:

an amplifier comprising:

at least three metal oxide semiconductor (MOS) transistors coupled in a stack and configured to receive and amplify an input radio frequency (RF) signal and provide an output RF signal; and a first capacitor coupled between a drain and a source of a first MOS transistor in the stack and a second capacitor coupled between a drain and a source of a second MOS transistor in the stack, wherein a third MOS transistor in the stack is controlled by the input RF signal and excludes a capacitor between a drain and source of the third MOS transistor.

14. The integrated circuit of claim 13, the at least three MOS transistors comprising N-channel MOS (NMOS) transistors.

15. A method of performing signal amplification, comprising:

amplifying an input signal with at least three transistors coupled in a stack to obtain an output signal; and bypassing at least two transistors in the stack with a first capacitor coupled between a drain and a source of a first transistor of the at least two transistors and a second capacitor coupled between a drain and a source of a second transistor of the at least two transistors, wherein a third transistor in the stack is controlled by the input signal and excludes a capacitor between a drain and source of the third transistor.

16. An apparatus comprising:

means for amplifying an input signal to obtain an output signal, the means for amplifying comprising at least three transistors coupled in a stack; and means for bypassing at least two transistors in the stack, the means for bypassing comprising a first capacitor coupled between a drain and a source of a first transistor of the at least two transistors and a second capacitor coupled between a drain and a source of a second transistor of the at least two transistors, wherein a third transistor in the stack is controlled by the input signal and excludes a capacitor between a drain and source of the third transistor.

* * * * *